(12) United States Patent
Fukao et al.

(10) Patent No.: US 12,094,622 B2
(45) Date of Patent: Sep. 17, 2024

(54) CONDUCTIVE RESIN COMPOSITION, CIRCUIT BOARD FABRICATED USING CONDUCTIVE RESIN COMPOSITION, AND METHOD OF MANUFACTURING CIRCUIT BOARD

(71) Applicant: Panasonic Intellectual Property Management Co., Ltd., Osaka (JP)

(72) Inventors: Tomohiro Fukao, Osaka (JP); Tomoaki Sawada, Osaka (JP); Takatoshi Abe, Osaka (JP); Kyosuke Michigami, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 218 days.

(21) Appl. No.: 17/556,119

(22) Filed: Dec. 20, 2021

(65) Prior Publication Data

US 2022/0208411 A1 Jun. 30, 2022

(30) Foreign Application Priority Data

Dec. 25, 2020 (JP) ................ 2020-217174

(51) Int. Cl.
*H01B 1/22* (2006.01)
*H01B 1/24* (2006.01)
*H05K 1/09* (2006.01)
*H05K 3/12* (2006.01)

(52) U.S. Cl.
CPC ............. *H01B 1/22* (2013.01); *H01B 1/24* (2013.01); *H05K 1/092* (2013.01); *H05K 3/1283* (2013.01)

(58) Field of Classification Search
CPC ... H01B 1/20; H01B 1/22; H01B 1/24; H05K 1/092; H05K 1/09; H05K 1/095
See application file for complete search history.

(56) References Cited

U.S. PATENT DOCUMENTS

| 4,529,787 A * | 7/1985 | Schmidt | C09G 1/10 |
| | | | 526/329.2 |
| 2006/0081819 A1 * | 4/2006 | Li | H01B 1/24 |
| | | | 252/500 |
| 2015/0257257 A1 * | 9/2015 | Satou | H05K 1/09 |
| | | | 156/330 |
| 2018/0163069 A1 * | 6/2018 | Wakita | C09D 7/62 |
| 2019/0385763 A1 * | 12/2019 | Jin | C08L 91/00 |
| 2020/0002582 A1 * | 1/2020 | Aoyagi | C09J 201/00 |
| 2020/0040231 A1 * | 2/2020 | Aoyagi | H05K 1/18 |

FOREIGN PATENT DOCUMENTS

| JP | 06-136299 | 5/1994 |
| JP | 08-092506 | 4/1996 |
| JP | 2001-135140 A | 5/2001 |
| JP | 2007-270137 A | 10/2007 |
| JP | 2010-055787 | 3/2010 |
| JP | 2019-121568 A | 7/2019 |
| WO | 2016/199678 | 12/2016 |
| WO | 2018/211887 A1 | 11/2018 |

* cited by examiner

*Primary Examiner* — Hoa C Nguyen
*Assistant Examiner* — Amol H Patel
(74) *Attorney, Agent, or Firm* — GREENBLUM & BERNSTEIN, P.L.C.

(57) ABSTRACT

An aspect of the present invention relates to a conductive resin composition containing an epoxy resin, a curing agent, and a conductive powder, in which a loss modulus of a dried product or semi-cured product of the conductive resin composition at 170° C. is 0.1 MPa or more and 15 MPa or less.

11 Claims, No Drawings

CONDUCTIVE RESIN COMPOSITION, CIRCUIT BOARD FABRICATED USING CONDUCTIVE RESIN COMPOSITION, AND METHOD OF MANUFACTURING CIRCUIT BOARD

CROSS-REFERENCE TO RELATED APPLICATIONS

This application claims the benefit of Japanese Application No. 2020-217174 filed on Dec. 25, 2020, which is incorporated herein by reference in its entirety.

FILED OF THE INVENTION

The present invention relates to a conductive resin composition, and a circuit board fabricated using the conductive resin composition, and a method of manufacturing the circuit board.

BACKGROUND OF THE INVENTION

In recent years, in the field of electronics, particularly in devices and conductive materials used for various interfaces such as sensors, displays, and artificial skin for robots, there is an increasing demand for mounting property and shape followability for objects to be mounted. In such applications, circuit boards (flexible boards) having flexibility (stretchability) are used. In recent years, it has been studied to impart stretchability not only to the insulating substrate materials of flexible boards but also to the conductive materials forming the conductive portions such as wiring and electrodes. As such conductive materials, it has been proposed to combine conductive metals with binder resins having stretchability.

Meanwhile, it is known that electronic parts and the like are mounted on substrates by reflow solder mounting. This solder is usually composed mainly of alloys containing tin (Sn), silver (Ag), copper (Cu), and the like.

However, in stretchable circuit boards in which conductive materials (conductive resin compositions) having flexibility are used in the formation of wiring and electrodes, it has become clear that various problems arise when reflow solder mounting is performed. For example, when the binder resin contained in the conductive material is a thermoplastic resin, there is a problem that the heat generated by reflow softens the binder resin, mutual diffusion between the conductive metal such as silver contained in the conductive material and the solder excessively occurs, and the conductive metal such as silver or copper from the conductive material is absorbed into the solder, that is, a so-called "metal leaching" phenomenon and disconnection occurs. When the binder resin contained in the conductive material is a thermosetting resin, there is a problem that the cured binder resin is not softened by the heat generated during reflow, mutual diffusion between the conductive metal contained in the conductive material and the solder does not occur, and thus poor wetting of solder occurs.

When solder mounting is performed, a metal mask is used in some cases, but in a case where the binder resin in the conductive material has a low molecular weight, there is also a problem that a mark is left (blocking property) on the conductive material surface in contact with the metal mask when the metal mask is peeled off from the conductive material when solder mounting is performed on the conductive material using a metal mask.

It has been reported so far that a conductive powder is combined with a binder resin such as an epoxy resin to form a conductive paste and this conductive paste is used to fabricate electrodes and that electronic parts are mounted on the electrodes via solder (JP H8-92506 A, JP 2010-55787 A, JP H6-136299 A, and WO 2016/199678 A).

However, it has been difficult to impart stretchability to a conductive material although reflow solder mounting can be performed on a circuit board fabricated using the conductive paste described in the above Patent Literatures.

SUMMARY OF THE INVENTION

The present invention has been made in view of such circumstances, and an object thereof is to provide a conductive resin composition that can be suitably used for reflow solder mounting and has stretchability, a circuit board fabricated using the conductive resin composition, and a method of manufacturing the circuit board.

The present inventors have found out that the above problems can be solved by a conductive resin composition having the following configuration as a result of diligent studies, and have completed the present invention by conducting further studies based on the findings.

The conductive resin composition according to an aspect of the present invention is a conductive resin composition containing an epoxy resin, a curing agent, and a conductive powder, in which a loss modulus of a dried product or semi-cured product of the conductive resin composition at 170° C. is 0.1 MPa or more and 15 MPa or less.

DETAILED DESCRIPTION OF THE INVENTION

Hereinafter, embodiments according to the present invention will be specifically described, but the present invention is not limited thereto.

A conductive resin composition according to the present embodiment is a conductive resin composition containing an epoxy resin, a curing agent, and a conductive powder, in which a loss modulus of a dried product or semi-cured product of the conductive resin composition at 170° C. is 0.1 MPa or more and 15 MPa or less.

By such a configuration, it is possible to provide a conductive resin composition that is suitable for a substrate to be subjected to reflow solder mounting while exhibiting stretchability. It is possible to provide a circuit board fabricated using the conductive resin composition and a method of manufacturing the circuit board.

Specifically, since the dried product or semi-cured product of the conductive resin composition has a loss modulus of 0.1 MPa or more and 15 MPa or less at 170° C., in a circuit board in which conductive portions such as wiring and electrodes are formed using the conductive resin composition, the conductive portions (the conductive resin composition) are appropriately softened at the time of reflow solder mounting, and mutual diffusion between the conductive powder and the solder enables proper parts mounting. It is not preferable that the loss modulus of the dried product or semi-cured product of the conductive resin composition at 170° C. is less than 0.1 MPa since there is a defect that a "metal leaching" phenomenon excessively occurs and parts cannot be properly mounted. It is not preferable that the loss modulus of the dried product or semi-cured product of the conductive resin composition at 170° C. is larger than 15

MPa since there is a defect that the resin composition is not softened and parts cannot be properly mounted because of poor solder wetting.

The loss modulus of the dried product or semi-cured product of the conductive resin composition at 170° C. is more preferably 0.5 MPa or more and 10.0 MPa or less, still more preferably 0.5 MPa or more and 5.0 MPa or less, particularly preferably 1.0 MPa or more and 3.0 MPa or less.

As the conductive resin composition contains an epoxy resin and a curing agent, it is possible to impart heat resistance that can withstand the heating process in parts mounting by reflow, to properly mount the parts, and to impart the bonding strength with the solder.

In the present embodiment, to have "stretchability" means that the elongation rate until breaking is 5.0% or more and plastic deformation hardly occurs.

The cured product of the conductive resin composition of the present embodiment has stretchability of preferably 5% or more and 500% or less, more preferably 30% or more and 500% or less. In the case of having an elongation percentage that the stretchability is 5% or more, there is an advantage that the followability when the conductive resin composition is deformed into an arbitrary shape is high and the conductive resin composition is hardly broken. The upper limit of stretchability is not particularly limited, but is preferably 500% or less from the viewpoint of maintaining the conductivity.

The conductive resin composition may be in a state of being a dried product or a semi-cured product when parts mounting is performed. The "dried product" in the present embodiment refers to a product in a state in which volatile components such as an organic solvent have been removed from the conductive resin composition. Such a dried product can be obtained by, for example, applying external energy such as heat and light to the conductive resin composition to remove volatile components such as an organic solvent.

The "semi-cured product" in the present embodiment refers to a product in a state (B stage) in which the conductive resin composition is cured to an extent so as to be further cured and thus at least a part of the composition is in an uncured state (a state containing an uncured product). For example, the viscosity gradually decreases as the conductive resin composition is heated, and then curing of resin components such as an epoxy resin contained in the conductive resin composition starts and the viscosity gradually increases as heating continues or the heating temperature is raised. As described above, a resin composition in a state in which the viscosity thereof has started to increase but curing thereof is not yet completed may be mentioned as an example of the "semi-cured product".

In the present embodiment, the "cured product" refers to a product in a state (C stage) in which the curing reaction of resin components such as an epoxy resin contained in the conductive resin composition has been completed through a process of applying external energy such as heat and light sufficient for curing to the conductive resin composition.

Hereinafter, the conductive resin composition of the present embodiment will be first specifically described.
(Epoxy Resin)

As the epoxy resin used in the conductive resin composition of the present embodiment, any epoxy resin can be used without particular limitation as long as it is an epoxy resin that makes it possible to set the loss modulus of a dried product or semi-cured product of the conductive resin composition at 170° C. to 0.1 MPa or more and 15 MPa or less.

In particular, in order to set the loss modulus to the above range, it is preferable that the epoxy resin used in the present embodiment has a weight average molecular weight of 80,000 or more and 1,000,000 or less. When the weight average molecular weight Mw of the epoxy resin is within the prescribed range, the response to heat is relatively slow and the conductive resin composition is gradually softened and cured at the same time. It is thus preferable since the conductive composition contained in the conductive resin composition is not absorbed into the solder too much at the time of soldering, mutual diffusion between the epoxy resin in the conductive resin composition and the solder appropriately occurs, and parts mounting can be properly performed. It is also preferable since the tackiness of the conductive resin composition is diminished and the conductive resin composition in contact with the metal mask is not deformed when the solder is printed using a metal mask or the conductive resin composition does not peel off when the metal mask is peeled off from the conductive resin composition. It is also preferable from the viewpoint of being able to impart stretchability to the dried product, semi-cured product, or cured product of the conductive resin composition.

It is not preferable that the weight average molecular weight Mw of the epoxy resin is less than 80,000 since the loss modulus is unlikely to fall within the above range. It is not preferable that the weight average molecular weight Mw of the epoxy resin is larger than 1,000,000 since there is a defect that the response to heat is significantly slow and the heat resistance of the dried product, semi-cured product, or cured product of the conductive resin composition cannot be sufficiently acquired. Also, it is not preferable from the viewpoint of productivity since a large quantity of energy is required for curing.

In the epoxy resin used in the conductive resin composition of the present embodiment, it is preferable that the polydispersity (Mw/Mn) of the average molecular weight of the epoxy resin satisfies the following Expression (1).

$$1.1 \leq Mw/Mn \leq 3.0 \tag{1}$$

In Expression (1), Mn denotes the number average molecular weight and Mw denotes the weight average molecular weight.

When the polydispersity of the average molecular weight of the epoxy resin is within the above range, it is considered that the loss modulus of the dried product or semi-cured product of the conductive resin composition can be more reliably set to the above range. It is also considered that the ratio of the high molecular weight components is high and it is thus possible to suppress an increase in tackiness of the semi-cured product of the conductive resin composition and further suppress a defect that the conductive resin composition in contact with the metal mask is deformed when the solder mounting is performed using a metal mask or the conductive resin composition peels off when the metal mask is peeled off from the conductive resin composition. It is also preferable since softening due to heat is suppressed, excessive occurrence of a "metal leaching" phenomenon is suppressed, and a defect that parts mounting cannot be properly performed can also be suppressed. It is also preferable from the viewpoint of being able to impart stretchability to the dried product, semi-cured product, or cured product of the conductive resin composition.

It is preferable that the epoxy equivalent of the epoxy resin used in the conductive resin composition of the present embodiment is 400 g/eq. or more and 10,000 g/eq. or less. By containing an epoxy resin having an epoxy equivalent in the above range, also when the reflow solder mounting is performed using the conductive resin composition of the present embodiment, the response to heat is relatively slow and the conductive resin composition is gradually softened and cured at the same time. Hence, at the time of soldering, the conductive powder contained in the conductive resin composition is not absorbed into the solder too much, and mutual diffusion between the conductive powder in the conductive resin composition and the solder is likely to appropriately occur. When the epoxy equivalent is less than 400 g/eq., the response of the conductive resin composition to heat is too fast, mutual diffusion between the solder and the conductive powder in the conductive resin composition at the time of soldering is insufficient, and poor wetting of solder is likely to occur. Meanwhile, it is not preferable that the epoxy equivalent exceeds 10,000 g/eq. since there is a defect that the response to heat is significantly slow and the heat resistance of the dried product, semi-cured product, or cured product of the conductive resin composition cannot be sufficiently acquired. Also, it is not preferable from the viewpoint of productivity since a large quantity of energy is required for curing.

The epoxy equivalent of the epoxy resin of the present embodiment is more preferably 1,000 g/eq. or more and 10,000 g/eq. or less, still more preferably 2,000 g/eq. or more and 10,000 g/eq. or less.

In the present embodiment, the epoxy resin can be used without particular limitation as long as it satisfies the above prescription, but specific examples thereof include an acrylic polymer having an epoxy group, bisphenol A type epoxy resin, bisphenol F type epoxy resin, bisphenol S type epoxy resin, aralkyl epoxy resin, phenol novolac type epoxy resin, alkylphenol novolac type epoxy resin, biphenol type epoxy resin, naphthalene type epoxy resin, dicyclopentadiene type epoxy resin, epoxidized products of condensates of phenols and aromatic aldehydes having a phenolic hydroxyl group, triglycidyl isocyanurate, and alicyclic epoxy resin. One of these may be used singly or two or more thereof may be used in combination.

As the acrylic polymer having an epoxy group, a polymer obtained by polymerizing a polymerization unit of a (meth) acrylate having an epoxy group can be used. The (meth) acrylate having an epoxy group used here is not particularly limited.

More specific examples of the polymerization unit include glycidyl (meth)acrylate, β-methylglycidyl (meth)acrylate, β-ethylglycidyl (meth)acrylate, glycidyl vinyl ether, o-vinylbenzyl glycidyl ether, m-vinylbenzyl glycidyl ether, p-vinylbenzyl glycidyl ether, o-isopropenylbenzyl glycidyl ether, m-isopropenylbenzyl glycidyl ether, and p-isopropenylbenzyl glycidyl ether. These may be used singly or two or more thereof may be used in combination.

The epoxy resin of the present embodiment may further have an acrylic monomer represented by the following Formula (1).

[Chemical formula 1]

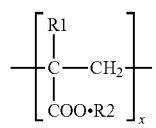

(1)

In Formula (1), R1 is hydrogen or a methyl group and R2 is hydrogen or an alkyl group.

The blending ratio of the epoxy resin in the conductive resin composition of the present embodiment is not particularly limited, but is preferably, for example, about 5.0 mass % or more and 30.0 mass % or less with respect to the entire conductive resin composition.

The conductive resin composition of the present embodiment may further contain a resin other than the epoxy resin, and urethane resin, acrylic resin, fluororesin, silicone resin and the like can be further added depending on the purpose.
(Curing Agent)

The curing agent contained in the resin composition of the present embodiment is not particularly limited as long as it acts as a curing agent for the epoxy resin. Examples of a curing agent that can be preferably used as the curing agent for epoxy resin include phenol resin, amine-based compounds, acid anhydrides, imidazole-based compounds, sulfide resin, and dicyandiamide. In addition to the above, a light/ultraviolet curing agent, a thermal cation curing agent and the like can also be used. Depending on the situation, one of these may be used singly or two or more thereof may be used in combination. Among these, imidazole-based compounds can be preferably used since imidazole-based compounds do not affect the loss modulus of the resin composition at 170° C. and the curing reaction of the resin composition can also sufficiently proceed. The content of curing agent is preferably 0.1 mass % or more and 5.0 mass % or less with respect to the epoxy resin.
(Conductive Powder)

By containing a conductive powder, the conductive resin composition of the present embodiment exhibits conductivity and can be used as a wiring material having a sufficiently low resistance (hereinafter, the conductive powder may be referred to as a conductive filler).

The conductive powder used in the present embodiment contains at least one of silver (Ag) and copper (Cu). Even if the conductive resin composition of the present embodiment contains silver (Ag) or copper (Cu) exhibiting excellent conductivity as a conductive powder, it is possible to suppress the occurrence of problems (metal leaching and the like) as described above at the time of soldering and to acquire sufficient bonding strength by mutual diffusion between the conductive powder and the solder at the time of soldering.

The conductive powder in the present embodiment may contain a powder having conductivity other than silver (Ag) and copper (Cu), and for example, elements such as gold, platinum, palladium, nickel, aluminum, magnesium, tungsten, cobalt, zinc, brass, molybdenum, tantalum, niobium, iron, tin, chromium, lead, titanium, manganese, stainless steel, and nichrome, and oxides, nitrides, carbides, and alloys containing these elements, and the like may be further used. It is also possible to use those in which a part or whole of the surface of these conductive powders or polymer material powders is coated with the above elements having conductivity and oxides, nitrides, carbides, and alloys containing these elements. One of these may be used singly or two or more thereof may be used at the same time.

The shape of the conductive powder in the present embodiment is not particularly limited, but a flat shape is preferable from the viewpoint of conductivity. For example, the aspect ratio of the thickness to the in-plane longitudinal direction is preferably 10 or more. When the aspect ratio is 10 or more, the surface area of the conductive powder is large, and it is easy to secure conductivity. When the aspect ratio is 1,000 or less, more favorable conductivity and printability can be secured, and the aspect ratio is preferably 10 or more and 1,000 or less, more preferably 20 or more and 500 or less. An example of the conductive filler having such an aspect ratio is a conductive filler having a tapped density of 6.0 g/cm$^3$ or less measured by the tapping method. It is more preferable that the tapped density is 2.0 g/cm$^3$ or less since the aspect ratio becomes larger.

The particle size of the conductive powder in the embodiment is not particularly limited, but the average particle size (particle size at a cumulative volume of 50%; D50) measured by the laser light scattering method is preferably 0.1 µm or more and 30.0 µm or less, more preferably 1.0 µm or more and 10 µm or less, for example, from the viewpoint of printability at the time of screen printing.

The surface of the conductive powder in the embodiment may be subjected to coupling treatment. Alternatively, the resin composition of the present embodiment may contain a coupling agent. This has an advantage that the adhesiveness between the binder resin and the conductive filler is further improved. As a coupling agent to be added to the resin composition or used for coupling treatment of the conductive filler, any coupling agent can be used without particular limitation as long as it is adsorbed on the filler surface or reacts with the filler surface, and specific examples thereof include silane coupling agents, titanate-based coupling agents, and aluminum-based coupling agents. One of these may be used or two or more thereof may be used at the same time. When a coupling agent is used in the present embodiment, the added amount thereof is preferably about 0.01 mass % or more and 10.0 mass % or less, more preferably about 0.1 mass % or more and 1.0 mass % or less with respect to the entire conductive powder.

The blending ratio of the conductive powder in the conductive resin composition of the present embodiment is not particularly limited as long as it is in a range in which conductivity can be acquired, but for example, the conductive powder is preferably contained at 70 mass % or more and 95 mass % or less with respect to the total solid content of the conductive resin composition. When the blending ratio of the conductive powder is in the above range, it is considered that the resistance value is not too large and the elongation property after curing of the composition is also superior. A more preferable blending ratio is 80 mass % or more and 90 mass % or less with respect to the total solid content of the conductive resin composition.

In addition to the conductive powder, a conductive carbon compound may be added to the conductive resin composition of the embodiment for the purpose of further improving the conductivity. This makes it possible to further impart conductivity without impairing the stretchability. Examples of such a conductive carbon compound include carbon black, acetylene black, fullerenes, and carbon nanotubes. One of these may be used or two or more thereof may be used at the same time.

The conductive resin composition in the present embodiment may further contain a conductive or semiconductive auxiliary in addition to the conductive powder. As such a conductive or semiconductive auxiliary, a conductive polymer, an ionic liquid, an inorganic compound used as an antistatic agent, and the like can be used. One of these may be used or two or more thereof may be used at the same time.

(Nonconductive Powder)

A nonconductive powder may be added to the composition of the present embodiment in order to control the loss modulus of the conductive resin composition in the range of 0.1 MPa or more and 10 MPa or less and to impart dispersion stability of the conductive powder and thixotropy for proper printing. The nonconductive powder that can be used in the present embodiment is not particularly limited, but examples thereof include silica, alumina, titanium oxide, barium titanate, magnesium titanate, calcium titanate, strontium titanate, zinc oxide, tin oxide, silica sand, clay, mica, wollastonite, diatomaceous earth, chromium oxide, cerium oxide, red iron oxide, antimony trioxide, magnesium oxide, zirconium oxide, barium sulfate, barium carbonate, calcium carbonate, silicon carbide, and silicon nitride. Depending on the situation, one of these may be used singly or two or more thereof may be used in combination. When a nonconductive powder is added, it is preferable to use the nonconductive powder at a content to be 0.1 mass % or more and 20 mass % or less with respect to the epoxy resin contained in the conductive resin composition.

(Other Constituents)

As described above, the conductive resin composition in the present embodiment contains an epoxy resin, a curing agent, and a conductive powder as essential constituents, but can further contain other additives, for example, a curing accelerator (curing catalyst), a dispersant, and a diluting solvent in a range in which the effects of the present invention are not impaired.

In addition to the above, the conductive resin composition may contain a flame retardant, a flame retardant promoter, a leveling (surface adjusting) agent, a colorant, a fragrance, a plasticizer, a pH adjuster, a viscosity adjuster, an ultraviolet absorber, an infrared absorber, an antioxidant, a preservative, a lubricant and the like, if necessary.

(Dispersant)

It is preferable to further add a dispersant to the conductive resin composition of the present embodiment for the purpose of improving the dispersion stability of conductive powder and resin. The dispersant is not particularly limited as long as the effect as a dispersant is acknowledged, but examples thereof include copolymers containing acid groups, block copolymers exhibiting affinity for pigments, phosphate ester-based compounds, polyether phosphate ester-based compounds, fatty acid ester-based compounds, alkylene oxide copolymers, modified polyether polymers, fatty acid derivatives, and urethane polymers. Examples of commercially available dispersants include DISPERBYK series manufactured by BYK; SOLSPERSE series manufactured by The Lubrizol Corporation; Sokalan, Tamol, Efka series manufactured by BASF SE; Nuosperse series manufactured by ELEMENTIS PLC; DISPARLON series manufactured by Kusumoto Chemicals, Ltd.; FLOWLEN series manufactured by KYOEISHA CHEMICAL CO., LTD.; and AJISPER series manufactured by Ajinomoto Fine-Techno Co., Inc. Depending on the situation, one of these may be used singly or two or more thereof may be used in combination. It is preferable to use the dispersant at a content to be 0.01 mass % or more and 10 mass % or less with respect to the conductive powder contained in the conductive resin composition.

(Curing Accelerator)

The curing accelerator that can be used in the present embodiment is not particularly limited, but for example, imidazoles and their derivatives, organophosphorus-based compounds, metal soaps such as zinc octanate, secondary amines, tertiary amines, and quaternary ammonium salts can be used. Depending on the situation, one of these may be used singly or two or more thereof may be used in combination. When a curing accelerator is used, it is preferable to use the curing accelerator at a content to be 0.01 mass % or more and 1 mass % or less with respect to the epoxy resin contained in the conductive resin composition.

(Diluting Solvent)

In the present embodiment, it is preferable to further contain a diluting solvent for the purpose of controlling workability and pot life at the time of printing. As the diluting solvent, for example, organic solvents such as hydrocarbon-based, ketone-based, ester-based, ether-based, glycol-based, glycol ester-based, glycol ether-based, and glyme-based solvents may be used, and one of these may be used or two or more thereof may be used together.

Specific examples of the hydrocarbon-based solvents include toluene, xylene, solvent naphtha, hexane, isohexane, cyclohexane, ethylcyclohexane, methylcyclohexane, heptane, isooctane, decane, pentane, isopentane, and isododecane.

Specific examples of the ketone-based solvents include acetone, methyl ethyl ketone, methyl isobutyl ketone, diisobutyl ketone, cyclohexanone, and diacetone alcohol.

Specific examples of the ester-based solvents include ethyl acetate, methyl acetate, butyl acetate, methoxybutyl acetate, amyl acetate, propyl acetate, isopropyl acetate, ethyl lactate, methyl lactate, and butyl lactate.

Specific examples of the ether-based solvents include isopropyl ether, methyl cellosolve, ethyl cellosolve, butyl cellosolve, dioxane, and methoxymethylpropane.

Specific examples of the glycol-based solvents include ethylene glycol, diethylene glycol, triethylene glycol, and propylene glycol.

Specific examples of the glycol ester-based solvents include ethylene glycol monoethyl ether acetate, propylene glycol monomethyl ether acetate, diethylene glycol monobutyl ether acetate, and diethylene glycol monoethyl ether acetate.

Specific examples of the glycol ether-based solvents include methyl carbitol, ethyl carbitol, butyl carbitol, methyl triglycol, propylene glycol monomethyl ether, propylene glycol monobutyl ether, methoxymethylbutanol, diethylene glycol monohexyl ether, propylene glycol monomethyl ether propionate, and dipropylene glycol methyl ether.

Specific examples of the glyme-based solvents include ethylene glycol dimethyl ether, diethylene glycol dimethyl ether, ethylene glycol diethyl ether, diethylene glycol diethyl ether, triethylene glycol dimethyl ether, diethylene glycol dibutyl ether, dimethoxytetraethylene glycol, and dipropylene glycol dimethyl ether.

Examples of other solvents include dichloromethane, trichlorethylene, perchlorethylene, γ-butyrolactam, ethylpyrrolidone, methylpyrrolidone, tetrahydrofuran, dimethylformamide, dibasic acid ester, ethyl ethoxypropionate, tetramethylene sulfone, dimethyl carbonate, diethyl carbonate, styrene monomer, acetonitrile, dioxolane, γ-butyrolactone, dimethyl sulfoxide, dioctyl phthalate, diisononyl phthalate, dibutyl phthalate, dimethyl succinate, and diethyl succinate. Depending on the situation, one of these may be used singly or two or more thereof may be used in combination.

(Method of Preparing Conductive Resin Composition)

The method of preparing the conductive resin composition of the present embodiment is not particularly limited, and for example, the above-described resin component, conductive powder, curing agent, and if necessary, a dispersant and the like, and a solvent are mixed and stirred so as to be uniform, whereby the conductive resin composition of the present embodiment can be obtained. The mixing and stirring method is not particularly limited, and a high shear dispersing device such as a planetary centrifugal mixer or a three roll mill is preferably used. Vacuum defoaming may be further performed.

(Application)

The conductive resin composition of the present embodiment is used to form wiring on a substrate by printing, embedding, and the like, electronic parts can be mounted thereon using solder, and the conductive resin composition does not lose the conductivity when being formed into a cured product and repeatedly stretched. The molded product, which is a cured product of the conductive resin composition of the present embodiment, can be used in electronics applications or as a material for various electronic parts in various applications. Specifically, for example, the conductive resin composition can be suitably used in patch devices, stretchable electrodes, displays as wiring circuits, foldable electronic paper, touch panels, touch sensors, solar cells, and the like.

In other words, the present invention also includes these conductive structures configured using the conductive resin composition.

(Circuit Board)

The circuit board in the present embodiment is a circuit board including a substrate and a conductive portion formed on the substrate using a cured product, dried product, or semi-cured product of the conductive resin composition described above.

The circuit board of the present embodiment is suitable for mounting of parts by solder, and it is preferable that the solder portion is formed on the conductive portion. Various electronic parts and the like can be mounted on the solder portion.

In the circuit board of the present embodiment, the thickness of the conductive portion is preferably 1 μm or more and 500 μm or less. This affords an advantage that the bonding strength between the conductive resin composition and the solder is sufficient and high conductivity can be imparted. When the thickness of the conductive portion is less than 1 μm, the contact area with the solder is small and sufficient bonding strength is not acquired. It is not preferable since the conductivity is also insufficient. It is not preferable that the thickness of the cured product, semi-cured product, or uncured product is 500 μm or more since the thickness hinders the subsequent printing of solder using a metal mask.

Such a circuit board of the present embodiment is not particularly limited, but can be obtained by, for example, the following manufacturing method. The manufacturing method is specifically a manufacturing method including: first forming wiring (conductive pattern, conductive film, or the like) on a substrate using the conductive resin composition described above; depositing solder on the wiring of the conductive resin composition of which at least a part is uncured; and simultaneously performing, by reflow, curing of the conductive resin composition and bonding of the conductive resin composition with the solder.

The manufacturing method as described above is considered to be a preferable method from the viewpoint of the bonding strength with the solder. After the bonding is completed, external energy such as heat and light may be further applied to cure the conductive resin composition. It is not preferable that the solder is deposited on the cured product (substantially not containing the uncured product) of the conductive resin composition and bonding with the solder is performed since there is a defect that the conductive resin composition is not sufficiently softened, the solder is not sufficiently wetted, and this results in poor bonding.

In the present embodiment, various films, woven fabrics and the like can be used as the base material on which wiring is formed. Specifically, for example, in addition to organic films such as polyester, polypropylene, polycarbonate, polyethylene sulfone, urethane, and silicone; fiber reinforced plastics such as those used in printed wiring boards; and woven fabrics made of fibers such as polyester, rayon, acrylic, wool, cotton, linen, silk, polyurethane, nylon and cupra can be used without particular limitation as long as they can be coated with the conductive resin composition or can withstand printing of the conductive resin composition.

The wiring, namely, the conductive pattern, the conductive film and the like can be formed by steps as described below. First, a coating film is formed by applying or printing the resin composition of the present embodiment on a base material, and volatile components contained in the coating film are removed by drying. The step of applying the conductive resin composition of the present embodiment on a base material is not particularly limited, but for example, coating methods using applicators, wire bars, comma rolls, gravure rolls, and the like and printing methods using screen, flat plate offset, flexo, inkjet, stamping, dispenser, squeegee, and the like can be used.

As described above, solder is then deposited on the wiring formed of the conductive resin composition in a state in which at least a part of the conductive resin composition is uncured. The method of solder deposition is not particularly limited, and solder deposition can be performed by a method similar to known solder mounting. A metal mask may be used when solder is deposited. The wiring formed of the resin composition of the present embodiment hardly leaves a mark when the metal mask is removed and is excellent in blocking property.

Thereafter, curing of the conductive resin composition and bonding of the conductive resin composition with the solder are simultaneously performed by reflow. The conditions for reflow are not particularly limited, and are, for example, preheating at 170° C. and main heating at 240° C. Further heating may be performed if necessary for curing of the conductive resin composition.

By using the conductive resin composition of the present embodiment in such a method of manufacturing a circuit board, mutual diffusion between the conductive powder in the resin composition and the metal in the solder appropriately occurs even when the resin composition is uncured. Thus, metal leaching by solder hardly occurs and the wettability of solder can be secured.

Hereinafter, the present invention will be described more specifically with reference to Examples, but the scope of the present invention is not limited thereto.

methacrylate was added so that the weight average molecular weight, polydispersity (Mw/Mn), and epoxy equivalent in the total amount of acrylate monomer were the values presented in the table (all less than 0.1 mass %). The number average molecular weight Mn, weight average molecular weight Mw, and polydispersity Mw/Mn presented in Table 1 below are values determined by the calculation methods described later.

[Chemical formula 2]

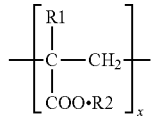

(1)

In Formula (1), R1 is hydrogen or a methyl group and R2 is hydrogen or an alkyl group.

The weight average molecular weight of epoxy resin A-1 was 200,000, and the epoxy equivalent thereof was 4545.
(Epoxy Resins A-2 to A-9)

Epoxy resins A-2 to A-9 were prepared in the same manner as the epoxy resin A-1 except that the epoxy equivalent was adjusted by the amount of glycidyl methacrylate added so that the weight average molecular weight, the polydispersity (Mw/Mn), and the epoxy equivalent were the values presented in Table 1, respectively.
(Curing Agent)
  B-1: Imidazole-based curing agent (2E4MZ manufactured by SHIKOKU CHEMICALS CORPORATION)
  B-2: Imidazole-based curing agent (2PZ-CN manufactured by SHIKOKU CHEMICALS CORPORATION)
  B-3: Amine-based curing agent (D2000 manufactured by MITSUI FINE CHEMICALS, INC.)
(Conductive Powder)
  Silver powder (TC703 manufactured by TOKURIKI HONTEN CO., LTD.)
  Silver coated copper powder (10% Ag/1100YP manufactured by MITSUI MINING & SMELTING CO., LTD.)
(Dispersant)
  Conductive powder dispersant (DISPERBYK-2155 manufactured by BYK)
(Organic Solvent)
  Diethylene glycol monoethyl ether acetate

TABLE 1

| | A-1 | A-2 | A-3 | A-4 | A-5 | A-6 | A-7 | A-8 | A-9 |
|---|---|---|---|---|---|---|---|---|---|
| Number average molecular weight Mn | 136263 | 141084 | 132489 | 47397 | 453957 | 132970 | 139874 | 31109 | 601866 |
| Weight average molecular weight Mw | 288396 | 290482 | 284973 | 98047 | 1023958 | 304876 | 299401 | 67738 | 1203947 |
| Polydispersity Mw/Mn | 2.1 | 2.1 | 2.2 | 2.1 | 2.3 | 2.3 | 2.1 | 2.2 | 2.0 |
| Epoxy equivalent [g/eq] | 4545 | 1852 | 9091 | 4545 | 4545 | 357 | 16667 | 4545 | 4545 |

EXAMPLES

First, the various materials used in the present Examples are as follows.
(Epoxy Resin A-1)

An epoxy resin (PMS-14-29 manufactured by Nagase ChemteX Corporation) in which an acrylic resin formed of acrylonitrile, glycidyl methacrylate, and an acrylate monomer represented by the following Formula (1) was dissolved and diluted with ethyl carbitol acetate was used. Glycidyl (Method of Preparing Conductive Resin Composition)

The conductive resin compositions of Examples 1 to 13 and Comparative Examples 1 to 5 were prepared by mixing the respective components at the blending ratio presented in Table 2. The respective components were uniformly mixed by performing stirring using a three roll mill (planetary centrifugal mixer (ARV-310 manufactured by THINKY CORPORATION), at 2000 rpm for 3 minutes), the pressure was then set to 2.6 kPa, and defoaming was performed by stirring the mixture for 1 minute to prepare a conductive resin composition.

The conductive resin composition of each of Examples and Comparative Examples obtained above was applied on a PET base material (PET-O2-BU manufactured by Mitsui Chemicals Tohcello, Inc.) using an applicator (manufactured by TP Giken Co., Ltd., standard film thickness: 200 μm), and heated in an electric oven at 100° C. for 60 minutes to obtain a dried product of the conductive resin composition.

(Method of Calculating Number Average Molecular Weight Mn, Weight Average Molecular Weight Mw, and Polydispersity Mw/Mn)

The molecular weights of the epoxy resins A-1 to A-9 were each measured using a gel permeation chromatograph (Nexera GPC system manufactured by Shimadzu Corporation).

The dried product of the conductive resin composition obtained above was immersed in THF, sufficiently stirred, and suction-filtered through a PTFE membrane filter to

TABLE 2

|  | Example 1 | Example 2 | Example 3 | Example 4 | Example 5 | Example 6 | Example 7 | Example 8 | Example 9 | Example 10 |
|---|---|---|---|---|---|---|---|---|---|---|
| Epoxy resin A-1 | 13.00 | | | | | 13.00 | 13.00 | 13.00 | 4.00 | 16.50 |
| Epoxy resin A-2 | | 13.00 | | | | | | | | |
| Epoxy resin A-3 | | | 13.00 | | | | | | | |
| Epoxy resin A-4 | | | | 13.00 | | | | | | |
| Epoxy resin A-5 | | | | | 13.00 | | | | | |
| Epoxy resin A-6 | | | | | | | | | | |
| Epoxy resin A-7 | | | | | | | | | | |
| Epoxy resin A-8 | | | | | | | | | | |
| Epoxy resin A-9 | | | | | | | | | | |
| Curing agent B-1 | 0.26 | 0.26 | 0.26 | 0.26 | 0.26 | 0.01 | 1.30 | | 0.08 | 0.33 |
| Curing agent B-2 | | | | | | | | 0.26 | | |
| Curing agent B-3 | | | | | | | | | | |
| Silver powder | 52.00 | 52.00 | 52.00 | 52.00 | 52.00 | 52.00 | 52.00 | 52.00 | 76.00 | 38.50 |
| Silver coated copper powder | | | | | | | | | | |
| Carbon black | | | | | | | | | | |
| Conductive powder dispersant | 1.30 | 1.30 | 1.30 | 1.30 | 1.30 | 1.30 | 1.30 | 1.30 | 1.90 | 0.96 |
| Inorganic nonconductive fine particles | | | | | | | | | | |
| Organic solvent | 34.63 | 34.63 | 34.63 | 34.63 | 34.63 | 35.21 | 35.89 | 34.63 | 19.07 | 45.00 |
| Solid content ratio in conductive composition [%] | 65 | 65 | 65 | 65 | 65 | 65 | 65 | 65 | 85 | 55 |
| Conductive powder ratio in solid content of conductive composition [%] | 80 | 80 | 80 | 80 | 80 | 80 | 80 | 80 | 95 | 70 |
| Loss modulus of dried product at 170° C. [MPa] | 1.5 | 1.8 | 1.6 | 0.13 | 9.1 | 2.2 | 0.9 | 1.4 | 7.0 | 0.52 |

|  | Example 11 | Example 12 | Example 13 | Comparative Example 1 | Comparative Example 2 | Comparative Example 3 | Comparative Example 4 | Comparative Example 5 |
|---|---|---|---|---|---|---|---|---|
| Epoxy resin A-1 | 13.00 | 13.00 | 13.00 | | | | | 11.71 |
| Epoxy resin A-2 | | | | | | | | |
| Epoxy resin A-3 | | | | | | | | |
| Epoxy resin A-4 | | | | | | | | |
| Epoxy resin A-5 | | | | | | | | |
| Epoxy resin A-6 | | | | 13.00 | | | | |
| Epoxy resin A-7 | | | | | 13.00 | | | |
| Epoxy resin A-8 | | | | | | 13.00 | | |
| Epoxy resin A-9 | | | | | | | 13.00 | |
| Curing agent B-1 | 0.26 | 0.26 | 0.26 | 0.26 | 0.26 | 0.26 | 0.26 | |
| Curing agent B-2 | | | | | | | | |
| Curing agent B-3 | | | | | | | | 1.29 |
| Silver powder | | | | 52.00 | 52.00 | 52.00 | 52.00 | 52.00 |
| Silver coated copper powder | 52.00 | 52.00 | 52.00 | | | | | |
| Carbon black | | 0.13 | | | | | | |
| Conductive powder dispersant | 1.30 | 1.30 | 1.30 | 1.30 | 1.30 | 1.30 | 1.30 | 1.30 |
| Inorganic nonconductive fine particles | | | 1.30 | | | | | |
| Organic solvent | 34.63 | 34.53 | 35.33 | 34.63 | 34.63 | 34.63 | 34.63 | 35.13 |
| Solid content ratio in conductive composition [%] | 65 | 65 | 65 | 65 | 65 | 65 | 65 | 65 |
| Conductive powder ratio in solid content of conductive composition [%] | 80 | 81 | 80 | 80 | 80 | 80 | 80 | 80 |
| Loss modulus of dried product at 170° C. [MPa] | 3.8 | 4.1 | 13.9 | 15.1 | Unmeasurable | Unmeasurable | 18.2 | Unmeasurable | remove insoluble matter, whereby a dissolved product of the conductive resin composition was obtained. The number average molecular weight Mn and weight average molecular weight Mw of the obtained dissolved product were calculated using the molecular weight calibration curve created from the monodisperse polystyrene standard sample. From these, the polydispersity Mw/Mn was calculated.

(Method of Measuring Loss Modulus at 170° C.)

The conductive resin composition of each of Examples and Comparative Examples obtained above was applied on a PET base material (PET-O2-BU manufactured by Mitsui Chemicals Tohcello, Inc.) using an applicator (manufactured by TP Giken Co., Ltd., standard film thickness: 200 μm), and heated in an electric oven at 100° C. for 60 minutes to obtain a dried product of the conductive resin composition. The dried product of each of Examples and Comparative Examples thus obtained was attached to a dynamic viscoelasticity measuring device (DMS6100 manufactured by Seiko Instruments Inc.). A test was conducted at a strain amplitude of 10 μm, a frequency of 10 Hz (sine wave), and a temperature rising rate of 5° C./min to measure the loss modulus at 170° C. The results are presented in Table 2.

[Evaluation Test]

(Method of Measuring Volume Resistivity: Conductivity)

The conductive resin composition of each of Examples and Comparative Examples obtained above was applied on a PET base material (PET-O2-BU manufactured by Mitsui Chemicals Tohcello, Inc.) using an applicator (manufactured by TP Giken Co., Ltd., standard film thickness: 200 μm), and heated in an electric oven at 100° C. for 60 minutes and at 170° C. for 60 minutes to obtain a cured product of the conductive resin composition. The film thickness of the cured product of each of Examples and Comparative Examples thus obtained was measured using a micrometer (MDC-MXD manufactured by Mitutoyo Corporation). The film thickness value was input to a resistivity meter (MCP-T370 manufactured by Nittoseiko Analytech Co., Ltd.), and the volume resistivity on the surface was measured by the 4-terminal method. The average value of the measurement results at 5 points or more was adopted as the volume resistance value and evaluated according to the following four grades.

Very good . . . less than $1.0 \times 10^{-4}$ Ω·cm

Good . . . $1.0 \times 10^{-4}$ Ω·cm or more and less than $5.0 \times 10^{-4}$ Ω·cm Fair . . . $5.0 \times 10^{-4}$ Ω·cm or more and less than $5.0 \times 10^{-3}$ Ω·cm Poor . . . $1.0 \times 10^{-3}$ Ω·cm or more (Solder Mounting Suitability)

The conductive resin composition of each of Examples and Comparative Examples obtained above was used to print fine lines having a width of 1 mm and a length of 13 mm on a polyimide film (UPILEX S manufactured by UBE INDUSTRIES, LTD.) using a screen plate, and the printed fine lines were heated in an electric oven at 100° C. for 60 minutes and 170° C. for 60 minutes. The obtained sample was attached to a transport carrier, and cream solder was printed on the conductive resin composition using a metal mask. Heating was performed at 260° C. for 5 minutes in an electric oven, the resultant was taken out from the electric oven and visually evaluated. The evaluation criteria are as follows.

Good . . . No abnormality

Poor . . . Occurrence of poor wetting of solder or breaking of conductive resin composition due to silver leaching (Elongation Resistance)

A resin film used for evaluation of elongation resistance was fabricated by the following method in conformity with the method described in Japanese Patent No. 6380942.

First, the raw materials used to fabricate the resin film and the blending composition are as follows.

Polyrotaxane: ("A1000" manufactured by ASM Inc., having PEG as axis molecule, α-cyclodextrin as cyclic molecule, and OH group as reactive group) 100 parts by mass Epoxy resin ("JER1003" manufactured by Mitsubishi Chemical Corporation, 7 to 8 methyl groups, bifunctional, molecular weight: 1300) 75 parts by mass Imidazole-based curing accelerator ("2E4MZ" manufactured by SHIKOKU CHEMICALS CORPORATION, 2-ethyl-4-methylimidazole) 1.1 parts by mass Crosslinker: ("DN950" manufactured by DIC Corporation, isocyanate) 45 parts by mass These raw materials were added to a solvent (methyl ethyl ketone) so that the solid content concentration became 40 mass %, and the respective components were uniformly mixed (at 300 rpm for 30 minutes) to prepare a resin composition for film.

Next, the obtained resin composition was applied on a 75 μm PET film (support) using a bar coater, dried at 100° C. for 60 minutes to remove the solvent, and then cured by being heated at 170° C. for 60 minutes.

The obtained cured product was formed into a film having dumbbell No. 6 shape (measurement site width: 4 mm, parallel portion length: 25 mm) having a thickness of 50 μm, and used as a resin film in the following evaluation.

The conductive resin composition of each of Examples and Comparative Examples obtained above was then used to print fine lines having a width of 1 mm and a length of 13 mm on the resin film obtained above using a screen plate, and the printed fine lines were heated in an electric oven at 100° C. for 60 minutes and 170° C. for 60 minutes to obtain a printed product of the conductive resin composition. The printed product of each of Examples and Comparative Examples thus obtained was fixed to a high accuracy automatic stage (PM80B-200X manufactured by COMS Co., Ltd.) at an interval of 80 mm. Both ends of the sample were elongated at 0.1 mm/s while measuring the resistance value using a digital multimeter (PC720M manufactured by Sanwa Electric Instrument Co., Ltd.). The elongation rate at the time of disconnection was calculated from the movement amount of the stage when the conductive composition was disconnected and the circuit was opened, and evaluated according to the following four grades.

Very good . . . 100% or more

Good . . . 75% or more and less than 100%

Fair . . . 50% or more and less than 75%

Poor . . . less than 50%

(Blocking Property)

The conductive resin composition of each of Examples and Comparative Examples obtained above was used to print fine lines having a width of 1 mm and a length of 13 mm on a polyimide film (UPILEX S manufactured by UBE INDUSTRIES, LTD.) using a screen plate, and the printed fine lines were heated in an electric oven at 100° C. for 60 minutes. The obtained sample was attached to a transport carrier (MagiCarrier), and cream solder was printed on the conductive resin composition using a metal mask. The mark left by removing the metal mask was visually evaluated. The evaluation criteria are as follows.

Good . . . No abnormality

Poor . . . Abnormalities such as mark and peeling off

The above results are presented in Table 3.

TABLE 3

|  | Example 1 | Example 2 | Example 3 | Example 4 | Example 5 | Example 6 | Example 7 | Example 8 | Example 9 | Example 10 |
|---|---|---|---|---|---|---|---|---|---|---|
| Conductivity | Good | Good | Good | Good | Good | Good | Good | Good | Very good | Fair |
| Elongation resistance | Very good | Good | Very good | Very good | Very good | Very good | Very good | Very good | Good | Very good |
| Blocking property | Good | Good | Good | Good | Very good | Good | Good | Good | Very good | Good |
| Solder mounting suitability | Good | Good | Good | Good | Good | Good | Good | Good | Good | Good |

|  | Example 11 | Example 12 | Example 13 | Comparative Example 1 | Comparative Example 2 | Comparative Example 3 | Comparative Example 4 | Comparative Example 5 |
|---|---|---|---|---|---|---|---|---|
| Conductivity | Fair | Very good | Good | Good | Good | Good | Good | Good |
| Elongation resistance | Very good | Very good | Good | Poor | Poor | Poor | Poor | Poor |
| Blocking property | Good | Good | Very good | Good | Good | Poor | Very good | Good |
| Solder mounting suitability | Good | Good | Good | Poor | Poor | Poor | Poor | Poor |

(Results and Discussion)

From the above results, it has been confirmed that all of the conductive resin compositions according to the present invention also have excellent bonding strength in solder mounting. The conductive resin compositions also exhibit excellent elongation resistance and blocking property at the time of solder printing, and the conductive resin composition exhibits significantly excellent blocking property particularly when a higher molecular weight epoxy resin is used (Example 5). It is assumed that this is because the softening of the resin by heating and the crosslinking by the curing agent simultaneously occur, thus excessive silver leaching does not occur, and proper soldering can be performed.

On the other hand, in all of the conductive resin compositions, which do not satisfy the loss modulus, of Comparative Examples, the solder was not sufficiently wetted with the conductive resin composition, and this resulted in poor bonding.

When the conductive resin compositions having a too high modulus of Comparative Examples 1 and 4 were used, sufficient elongation resistance was not acquired. It is considered that this is because the stretchability of the cured product is insufficient and cracking is likely to occur.

When the conductive resin composition having a too high epoxy equivalent of epoxy resin of Comparative Example 2 was used, the curing was too slow so that the loss modulus was unmeasurable. Thus, the loss modulus was too low, solder mounting also resulted in poor bonding, and sufficient elongation resistance was not acquired.

Also in Comparative Example 3 in which an epoxy resin having an excessively small molecular weight was used and in Comparative Example 5 in which an imidazole-based curing agent was not used as a curing agent, curing was too slow so that the loss modulus was unmeasurable or the loss modulus was too low because of the low molecular weight component in the dried product. Therefore, the solder mounting resulted in poor bonding in Comparative Examples 3 and 5, and sufficient elongation resistance was not acquired in Comparative Examples 3 and 5. In Comparative Example 3, the blocking property was also inferior, and it is considered that this is because a low molecular weight epoxy resin was used in Comparative Example 3, this affected the tackiness of the conductive resin composition, and the blocking property was deteriorated.

The invention claimed is:

1. A conductive resin composition comprising an epoxy resin, a curing agent, and a conductive powder,
    wherein a loss modulus of a dried product or semi-cured product of the conductive resin composition at 170° C. is 0.5 MPa or more and 15 MPa or less;
    the epoxy resin has a weight average molecular weight (Mw) of 80,000 or more and 1,000,000 or less, and
    an imidazole-based compound is contained as the curing agent at a content of 0.1 mass % or more and 5.0 mass % or less with respect to the epoxy resin.

2. The conductive resin composition according to claim 1, wherein a polydispersity (Mw/Mn) of an average molecular weight of the epoxy resin satisfies following Formula (1):

$$1.1 \leq Mw/Mn \leq 3.0 \tag{1}$$

(where Mn denotes a number average molecular weight and Mw denotes a weight average molecular weight).

3. The conductive resin composition according to claim 1, wherein an epoxy equivalent of the epoxy resin is 400 g/eq. or more and 10,000 g/eq. or less.

4. The conductive resin composition according to claim 1, wherein the conductive powder is contained at 70 mass % or more and 95 mass % or less with respect to a total solid content of the conductive resin composition.

5. The conductive resin composition according to claim 1, wherein the conductive powder contains at least one of silver (Ag) and copper (Cu).

6. The conductive resin composition according to claim 5, wherein the conductive powder further contains a conductive carbon compound.

7. The conductive resin composition according to claim 1, wherein the conductive resin composition further comprises nonconductive fine particles.

8. A circuit board comprising a substrate and a conductive portion formed on the substrate by a cured product, dried product, or semi-cured product of the conductive resin composition according to claim 1.

9. The circuit board according to claim 8, wherein the conductive portion has a thickness of 1 μm or more and 500 μm or less.

10. The circuit board according to claim 8, wherein a solder portion is formed on the conductive portion.

11. A method of manufacturing a circuit board, the method comprising:
   forming wiring on a substrate using the conductive resin composition according to claim 1;
   depositing solder on the wiring of the conductive resin composition of which at least a part is uncured; and
   simultaneously performing, by reflow, curing of the conductive resin composition and bonding of the conductive resin composition with the solder.

* * * * *